(12) United States Patent
Satoh et al.

(10) Patent No.: US 10,968,514 B2
(45) Date of Patent: Apr. 6, 2021

(54) SUBSTRATE MOUNTING TABLE

(71) Applicant: TOKYO ELECTRON LIMITED, Tokyo (JP)

(72) Inventors: Kohichi Satoh, Nirasaki (JP); Hideaki Yamasaki, Nirasaki (JP); Motoko Nakagomi, Nirasaki (JP); Junya Oka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 103 days.

(21) Appl. No.: 16/193,297

(22) Filed: Nov. 16, 2018

(65) Prior Publication Data
US 2019/0153597 A1    May 23, 2019

(30) Foreign Application Priority Data
Nov. 22, 2017 (JP) .............................. JP2017-224738

(51) Int. Cl.
| | |
|---|---|
| *H01L 21/687* | (2006.01) |
| *C23C 16/458* | (2006.01) |
| *H01J 37/32* | (2006.01) |
| *C23C 16/505* | (2006.01) |
| *C23C 16/08* | (2006.01) |
| *H01L 21/285* | (2006.01) |

(52) U.S. Cl.
CPC .... *C23C 16/4581* (2013.01); *H01J 37/32715* (2013.01); *H01L 21/68735* (2013.01); *H01L 21/68757* (2013.01); *C23C 16/08* (2013.01); *C23C 16/505* (2013.01); *H01J 2237/3321* (2013.01); *H01J 2237/3328* (2013.01); *H01L 21/28568* (2013.01)

(58) Field of Classification Search
CPC ....... B25B 11/00; B25B 11/007; B25B 11/02; B23Q 1/03; B23Q 3/00; B23Q 3/06; H01L 21/68735; H01L 21/68757
See application file for complete search history.

(56) References Cited

U.S. PATENT DOCUMENTS

| | | | |
|---|---|---|---|
| 8,398,466 B2* | 3/2013 | Sung | ...................... B24B 53/017 451/443 |
| 2003/0054746 A1* | 3/2003 | Nussbaumer | ............ B24D 7/06 451/548 |
| 2011/0275288 A1* | 11/2011 | Sung | ........................ B24B 53/12 451/56 |
| 2019/0153597 A1* | 5/2019 | Satoh | ................... C23C 16/4581 |

FOREIGN PATENT DOCUMENTS

| | | |
|---|---|---|
| JP | 2011-119326 A | 6/2011 |
| KR | 10-2013-0058312 A | 6/2013 |

* cited by examiner

*Primary Examiner* — Lee D Wilson
(74) *Attorney, Agent, or Firm* — Nath, Goldberg & Meyer; Jerald L. Meyer

(57) ABSTRACT

There is provided a substrate mounting table for use in a plasma-based processing apparatus that performs a plasma-based process on a substrate inside a processing container, which includes a substrate mounting portion having a front surface subjected to a mirroring treatment and on which the substrate is mounted, and an edge portion located around the substrate mounting portion and treated to have an uneven shape.

5 Claims, 5 Drawing Sheets

SUBSTRATE MOUNTING TABLE

CROSS-REFERENCE TO RELATED APPLICATION

This application is based upon and claims the benefit of priority from Japanese Patent Application No. 2017-224738, filed on Nov. 22, 2017, the entire contents of which are incorporated herein by reference.

TECHNICAL FIELD

The present disclosure relates to a substrate mounting table.

BACKGROUND

In manufacturing a semiconductor device, there are sonic cases where a plasma-based process such as a film-forming process, an etching process or the like is performed on a substrate. In such a plasma-based process, for example, inside a processing container in which a pair of parallel flat plate electrodes (upper electrode and lower electrode) are arranged, plasma of a processing gas is generated by mounting a substrate on a stage functioning as the lower electrode and applying high frequency power to one of the electrodes to form a high frequency electric field between the electrodes.

As the stage, a configuration in which a roughened portion having a surface roughness Ra of 2 μm or more and 6 μm or less is formed on a surface on which a substrate is mounted, and a configuration in which a surface is smoothly formed are known.

However, in the configuration in which a roughened portion is formed on a surface on which a substrate is mounted, the substrate electrically floats from the stage so that a potential difference between the substrate and the stage is generated. As a result, arc discharge (arcing) may occur when a high voltage is applied between the upper electrode and the lower electrode. On the other hand, in the configuration in which a surface is smoothly formed, when the plasma-based process is repeatedly performed, reaction products may adhere and accumulate on a portion of the surface of the stage where the substrate is not mounted. As a result, the accumulated reaction products may peel off, which causes particles.

SUMMARY

Some embodiments of the present disclosure provide a substrate mounting table capable of suppressing generation of arcing and particles.

According to one embodiment of the present disclosure, there is provided a substrate mounting table for use in a plasma-based processing apparatus that performs a plasma-based process on a substrate inside a processing container, including: a substrate mounting portion having a front surface subjected to a mirroring treatment and on which the substrate is mounted; and an edge portion located around the substrate mounting portion and treated to have an uneven shape.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
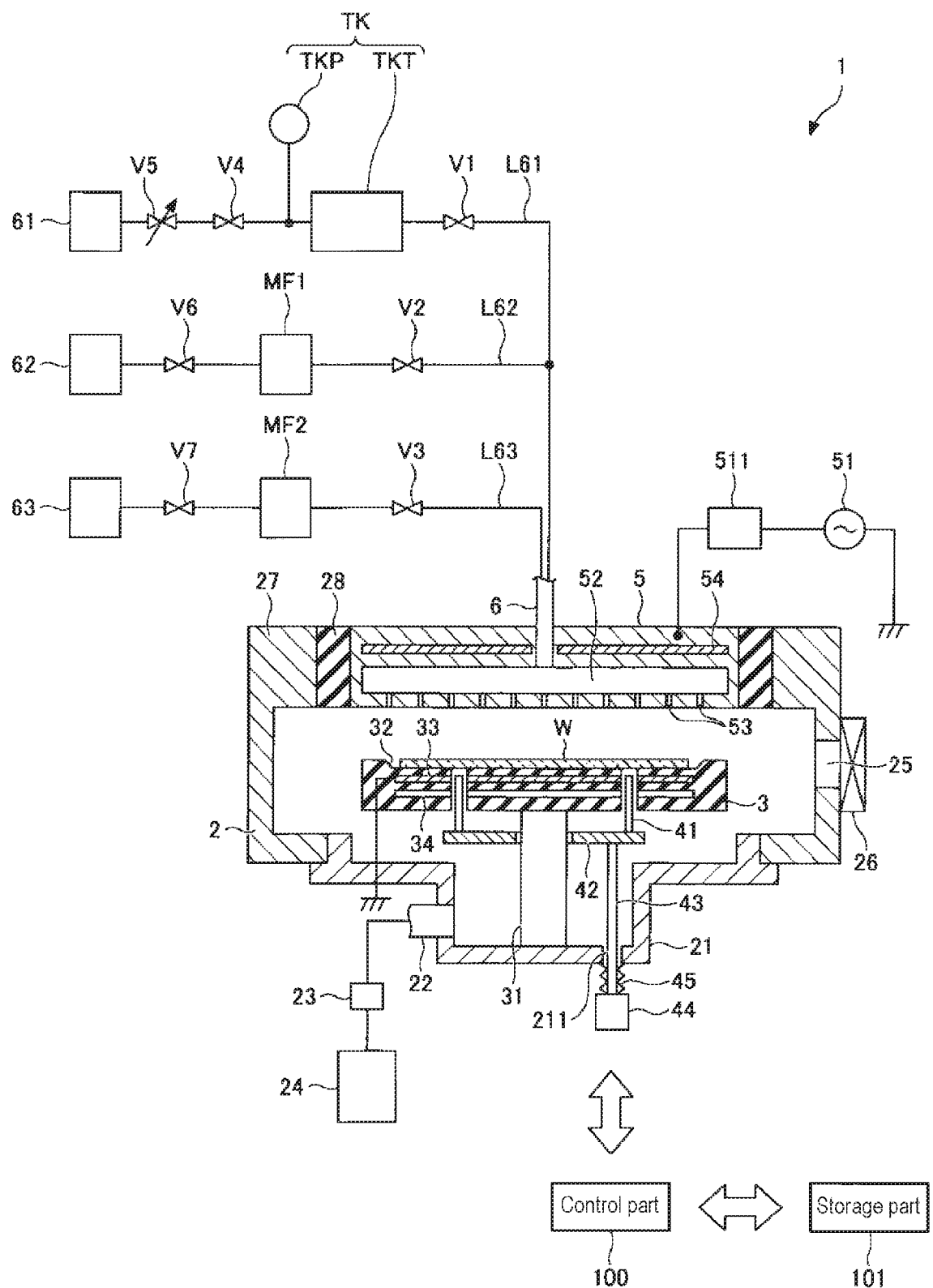
FIG. 1 is a view showing the overall configuration of a plasma-based processing apparatus according to an embodiment of the present disclosure.

Hereinafter, modes for carrying out the present disclosure will be described with reference to the drawings. Through the specification and the figures, the same or similar elements and parts are denoted by the same reference numerals, and explanation thereof will not be repeated. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Plasma-Based Processing Apparatus]

An example of a plasma-based processing apparatus to which a stage according to an embodiment of the present disclosure can be applied will be described below. FIG. 1 is a view showing the overall configuration of the plasma-based processing apparatus according to an embodiment of the present disclosure.

As shown in FIG. 1, the plasma-based processing apparatus 1 is an apparatus that performs a process of forming a titanium (Ti) film on a semiconductor wafer (hereinafter referred to as "wafer W") as a substrate, by a plasma CVD method. The plasma-based processing apparatus 1 includes a substantially cylindrical airtight processing container 2. An exhaust chamber 21 is installed in the central portion of a bottom wall of the processing container 2.

The exhaust chamber 21 has a substantially cylindrical shape that protrudes downward. An exhaust path 22 is connected to the exhaust chamber 21, for example, in a lateral surface of the exhaust chamber 21.

An exhaust part 24 is coupled to the exhaust path 22 via a pressure regulating part 23. The pressure regulating part 23 includes a pressure regulating valve such as a butterfly valve. The exhaust path 22 is configured so as to depressurize the interior of the processing container 2 by the exhaust part 24. A transfer port 25 is formed in a lateral surface of the processing container 2. The transfer port 25 is configured to be opened and closed by a gate valve 26. The wafer W is transferred between the processing container 2 and a transfer chamber (not shown) via the transfer port 25.

A stage 3 which is a substrate mounting table for holding the wafer W in a substantially horizontal posture, is installed inside the processing container 2. The stage 3 is formed in a substantially circular shape in a plan view, and is supported by a support member 31. A circular recess 32 for mounting the wafer W having a diameter of, e.g., 300 mm thereon is formed in the surface of the stage 3. The recess 32 has an inner diameter slightly larger (for example, by about 1 mm to 4 mm) than the diameter of the wafer W. The depth of the recess 32 is substantially the same as the thickness of the wafer W, for example. The stage 3 is made of, for example, a ceramic material such as aluminum nitride (AlN). Further, the stage 3 may be formed of a metal material such as nickel (Ni). Instead of the recess 32, a guide ring for guiding the wafer W may be installed in a peripheral edge portion of the surface of the stage 3.

For example, a grounded lower electrode 33 is buried in the stage 3. A heating mechanism 34 is buried under the lower electrode 33. The heating mechanism 34 heats the wafer W mounted on the stage 3 to a set temperature (for example, a temperature of 350 to 700 degrees C.) with power fed from a power supply (not shown) based on a control signal provided from a control part 100. In a case where the stage 3 is entirely made of metal, since the entire stage 3 functions as a lower electrode, it is not necessary to bury the lower electrode 33 in the stage 3. The stage 3 is provided with a plurality of lift pins 41 (for example, three lift pins) for holding and moving up/down the wafer W mounted on the stage 3. The lift pins 41 may be made of, for example, ceramics such as alumina ($Al_2O_3$), quartz or the like. Lower ends of the lift pins 41 are attached to a support plate 42. The support plate 42 is coupled to an elevating mechanism 44 installed outside the processing container 2 via an elevating shaft 43.

For example, the elevating mechanism 44 is installed below the exhaust chamber 21. A bellows 45 is installed between the elevating mechanism 44 and an opening 211 formed in a lower surface of the exhaust chamber 21. The elevating shaft 43 passes through the opening 211. The support plate 42 may have a shape capable of moving up and down without interfering with the support member 31 of the stage 3. The lift pins 41 are configured to be moved up and down between above the surface of the stage 3 and below the surface of the stage 3 by means of the elevating mechanism 44.

A gas supply part 5 is installed in a ceiling wall 27 of the processing container 2 with an insulating member 28 interposed between the gas supply part 5 and the ceiling wall 27. The gas supply part 5 constitutes an upper electrode and faces the lower electrode 33. A high frequency power supply 51 is coupled to the gas supply part 5 via a matching device 511. By supplying high frequency power from the high frequency power supply 51 to the upper electrode (the gas supply part 5), a high frequency electric field is generated between the upper electrode (the gas supply part 5) and the lower electrode 33. The gas supply part 5 includes a hollow gas supply chamber 52. For example, a plurality of holes 53, for dispersedly supplying a processing gas into the processing container 2 therethrough, is evenly formed in a lower surface of the gas supply chamber 52. A heating mechanism 54 is buried above the gas supply chamber 52 in the gas supply part 5. The heating mechanism 54 is heated to a set temperature with power fed from a power supply (not shown) based on a control signal provided from the control part 100.

A gas supply path 6 is formed in the gas supply chamber 52. The gas supply path 6 is in communication with the gas supply chamber 52. A gas source 61, a gas source 62 and a gas source 63 are coupled to the upstream side of the gas supply path 6 via a gas line L61, a gas line L62 and a gas line L63, respectively. In one embodiment, the gas source 61 is a supply source of an inert gas such as an Ar gas, a $N_2$ gas or the like. The gas source 62 is a supply source of a reaction gas such as a $H_2$ gas, an $NH_3$ gas or the like. The gas source 62 may also be used as a supply source of an inert gas (an Ar gas, a $N_2$ gas or the like) for purging. The gas source 63 is a supply source of a reaction gas such as a $TiCl_4$ gas or the like. The gas source 63 may also be used as a supply source of an inert gas (an Ar gas, a $N_2$ gas or the like) for purging. The gas line L61 and the gas line L62 are connected to each other between a valve V1 in the gas line L61 and the gas supply path 6, and between a valve V2 in the gas line L62 and the gas supply path 6.

The gas source 61 is coupled to the gas supply path 6 via the gas line L61. In the gas line L61, a pressure regulating valve V5, a valve V4, a pressure boosting part TK and the valve V1 are disposed in this order from the side of the gas source 61. The pressure boosting part TK is interposed between the valve V1 and the valve V4 in the gas line L61. The valve V4 is interposed between the pressure regulating valve V5 and the pressure boosting part TK. The pressure boosting part TK includes a gas storage tank TKT. With the valve V1 closed and the valve V4 opened, the gas storage tank TKT of the pressure boosting part TK is configured to store a gas supplied from the gas source 61 via the gas line L61 and the valve V4 and to boost an internal gas pressure of the gas storage tank TKT. The pressure boosting part TK includes a pressure gauge TKP. The pressure gauge TKP measures the internal gas pressure of the gas storage tank TKT included in the pressure boosting part TK and transmits the measurement result to the control part 100. The valve V1 is interposed between the pressure boosting part TK and the gas supply path 6.

The gas source 62 is coupled to the gas supply path 6 via the gas line L62. In the gas line L62, a valve V6, a mass flow controller MF1 and the valve V2 are disposed in this order from the side of the gas source 62.

The gas source 63 is coupled to the gas supply path 6 via the gas line L63. In the gas line L63, a valve V7, a mass flow controller MF2 and a valve V3 are disposed in this order from the side of the gas source 63.

The plasma-based processing apparatus 1 includes the control part 100 and a storage part 101. The control part 100 includes a CPU, a RAM, a ROM and the like (all not shown) and controls the overall operation of the plasma-based processing apparatus 1, for example, by causing the CPU to execute a computer program stored in the ROM or the storage part 101. Specifically, the control part 100 executes a plasma-based process or the like on the wafer W by causing the CPU to execute a control program stored in the storage part 101 to control the operation of each component of the plasma-based processing apparatus 1.

[Stage]

Figure 2:
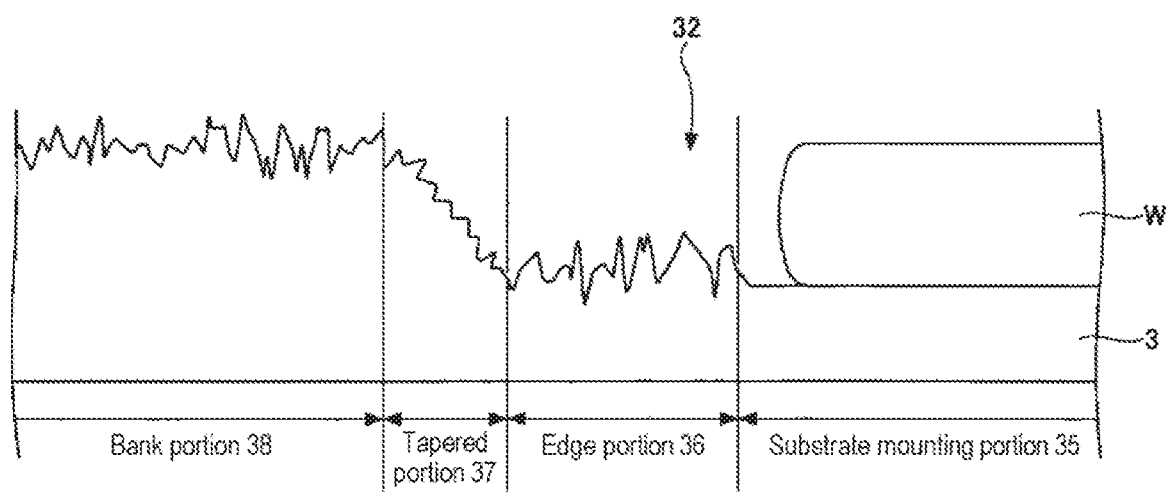
FIG. 2 is a schematic sectional view of a stage according to an embodiment of the present disclosure.

The stage 3, according to the embodiment of the present disclosure, will be described. The stage 3, according to the embodiment of the present disclosure, for example, functions as a mounting table for mounting thereon the wafer W when performing a predetermined plasma-based process on the wafer W inside the processing container 2 of the above-described plasma-based processing apparatus 1. FIG. 2 is a schematic sectional view of the stage 3 according to the embodiment of the present disclosure.

The stage 3 includes a substrate mounting portion 35, an edge portion 36, a tapered portion 37 and a bank portion 38. The substrate mounting portion 35, the edge portion 36, the tapered portion 37 and the bank portion 38 are formed in this order from the center portion of the stage 3 toward the outer peripheral portion thereof.

The substrate mounting portion 35 is formed at the central portion of the bottom surface of the recess 32. The substrate mounting portion 35 may have substantially the same shape as the wafer W and may have, for example, a circular shape having a diameter of 298 mm to 300 mm. A surface of the substrate mounting portion 35 has been subjected to a minoring treatment to become a mirror surface. This mirror surface means that the arithmetic average roughness (hereinafter referred to as "surface roughness Ra") defined in JISB0601: 2013 is 0.4 µm or less. Since the substrate mounting portion 35 has been subjected to the mirroring treatment, a distance between the front surface of the stage 3 and the back surface of the wafer W is narrowed. As a result, it is possible to prevent the arc discharge (arcing) from occurring between the front surface of the stage 3 and the back surface of the water W.

The edge portion 36 is formed around the substrate mounting portion 35 so as to surround the substrate mounting portion 35. The edge portion 36 may have, for example, an annular shape. The inner diameter of the edge portion 36 may be substantially the same as the diameter of the wafer W and may be, for example, 298 mm to 300 mm. The outer diameter of the edge portion 36 may be slightly larger than the diameter of the wafer W and may be, for example, 301 mm to 303 mm. The edge portion 36 is treated to have an uneven shape of a larger surface roughness Ra than the substrate mounting portion 35. Since the edge portion 36 is treated to have an uneven shape, a frictional force generated between the front surface of the edge portion 36 and the back surface of the wafer W is larger than that generated between the front surface of the substrate mounting portion 35 and the back surface of the wafer W. This restricts the movement of the wafer W from the substrate mounting portion 35 to the edge portion 36. Thus, a positional deviation of the wafer W relative to the stage 3 can be suppressed. Further, since the edge portion 36 is treated to have an uneven shape, the adhesion of a film formed on the edge portion 36 by the plasma-based process to the stage 3 is improved. Therefore, the film formed on the edge portion 36 is prevented from being peeled off. As a result, it is possible to suppress generation of particles due to the peeling-off of the film. The surface roughness Ra of the edge portion 36 may fall within a range of 1 µm to 10 µm, in particular, from the viewpoint of suppressing the peeling-off of the film formed on the edge portion 36.

The tapered portion 37 is formed on an inner surface of the recess 32. In other words, the tapered portion 37 is formed around the edge portion 36 so as to surround the edge portion 36. The tapered portion 37 prevents the wafer W from jumping out from the recess 32. The tapered portion 37 is formed between the bottom surface of the recess 32 and the bank portion 38. The tapered portion 37 is treated to have an uneven shape of a larger surface roughness Ra than the substrate mounting portion 35. Since the tapered portion 37 is treated to have an uneven shape, the adhesion of a film formed on the tapered portion 37 by the plasma-based process to the stage 3 is improved. Therefore, the film formed on the tapered portion 37 is prevented from being peeled off. As a result, it is possible to suppress generation of particles due to the peeling-off of the film. The surface roughness Ra of the tapered portion 37 may be smaller than the surface roughness Ra of the edge portion 36 and may be, for example, 2 µm, from the viewpoint of easy surface treatment.

The bank portion 38 is formed around the tapered portion 37 so as to surround the tapered portion 37. In other words, the bank portion 38 is formed on a peripheral portion of the recess 32. For example, the bank portion 38 is substantially flush with the front surface of the wafer W mounted on the substrate mounting portion 35. The bank portion 38 is treated to have an uneven shape of a surface roughness Ra larger than the substrate mounting portion 35. Since the bank portion 38 is treated to have an uneven shape, the adhesion of a film formed on the bank portion 38 by the plasma-based process to the stage 3 is improved. Therefore, the film formed on the bank portion 38 is prevented from being peeled off. As a result, it is possible to suppress generation of particles due to the peeling-off of the film. The surface roughness Ra of the bank portion 38 may be the same as the surface roughness Ra of the edge portion 36 and may be, for example, 1 µm to 10 µm, from the viewpoint of easy surface treatment.

[Effects]

The effects achieved when using the stage 3 according to the embodiment of the present disclosure will be described. In the following description, stages 3 all made of Ni are used.

First, the plasma-based processing apparatus 1 including the stage 3 according to an example in which the substrate mounting portion 35, the edge portion 36, the tapered portion 37 and the bank portion 38 respectively have the surface roughness Ra of 0.02 µm (mirror surface), 10 µm, 2 µm and 10 µm was used to perform the plasma-based process on a wafer W. In addition, a plasma-based processing apparatus including a stage according to a comparative example in which the substrate mounting portion 35, the edge portion 36, the tapered portion 37 and the bank portion 38 respectively have the surface roughness Ra of 10 µm, 10 µm, 0.4 µm and 10 µm is used to perform the plasma-based process on a wafer W. Conditions of the plasma-based process according to the example and the comparative example are as follows.

(Conditions of Plasma-Based Process)
  Flow rate of $TiCl_4$ gas: 1 to 200 mL/min (sccm)
  Flow rate of Ar gas: 100 to 10,000 mL/min (sccm)
  Flow rate of $H_2$ gas: 1 to 10,000 mL/min (sccm)
  Pressure: 13.3 to 1,333 Pa (0.1 to 10 Torr)
  Film-forming temperature: 350 to 700 degrees C.
  High frequency power: 10 to 3,000 W and 100 kHz to 100 MHz
  Flow rate of $TiCl_4$ gas: 1 to 200 mL/min (sccm)

Figure 3:
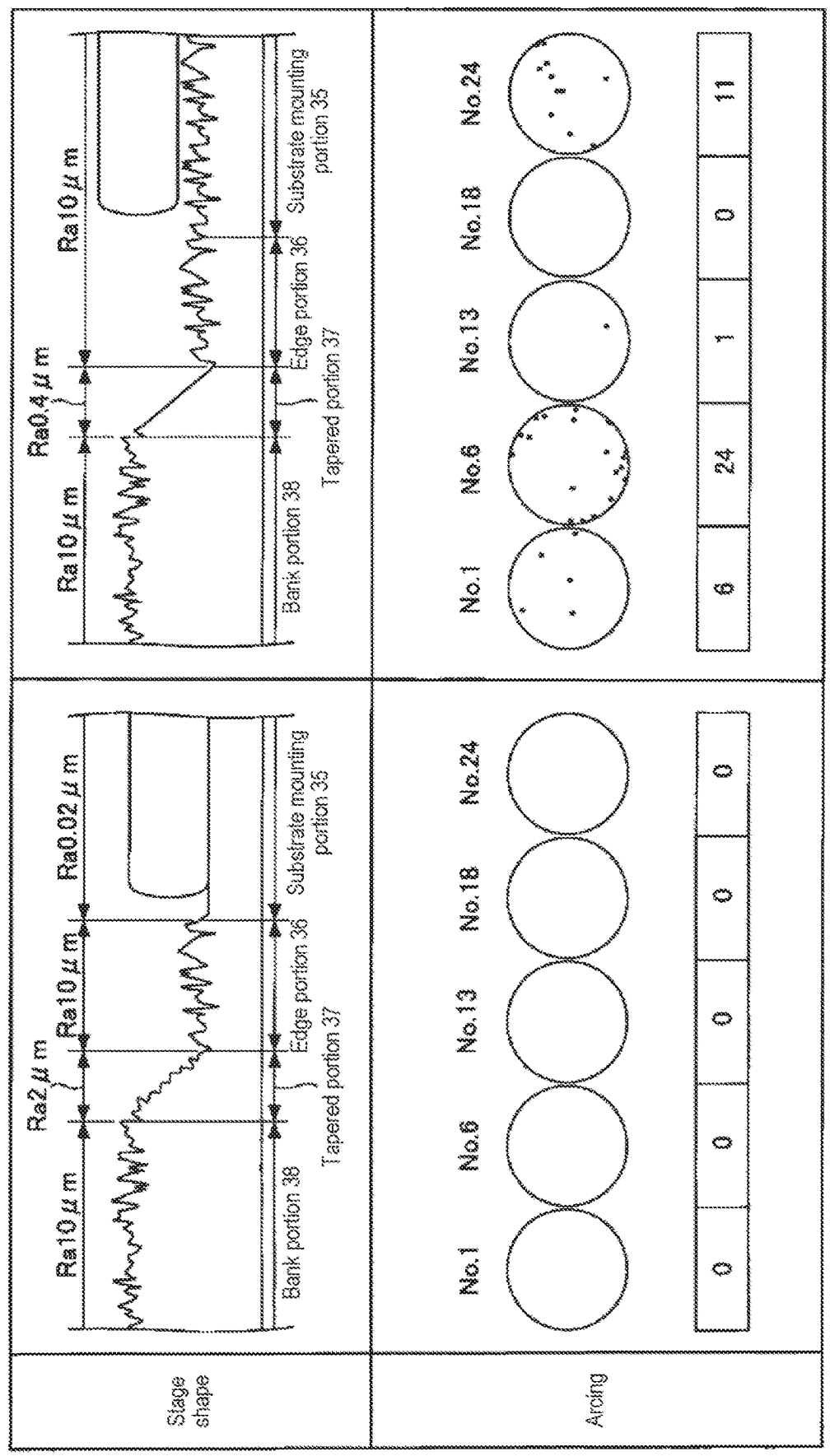
FIG. 3 is a view for explaining a relationship between a stage shape and an arcing occurrence number.

FIG. 3 is a view for explaining a relationship between a stage shape and an arcing occurrence number. The upper left of FIG. 3 shows a schematic shape of the stage 3 according to the example and the lower left of FIG. 3 shows the number of occurrences of arcing between the front surface of the stage 3 and the back surface of the wafer W after performing the plasma-based process on the wafer W mounted on the stage 3 according to the example. The upper right of FIG. 3 shows a schematic shape of the stage according to the comparative example and the lower right of FIG. 3 shows the position of occurrence and the number of occurrences of arcing between the front surface of the stage and the back surface of the wafer W after performing the plasma-based process on the wafer W mounted on the stage according to the comparative example. In the lower left and the lower right of FIG. 3, "No. 1", "No. 6", "No. 13", "No. 18" and "No. 24" represent results of 1st, 6th, 13th, 18th and 24th Runs of 25 Runs of the wafer W subjected to the plasma-based process, respectively. In the lower right of FIG. 3, each plot shows the position of occurrence of arcing.

As shown in the lower left of FIG. 3, in the case of using the stage 3 according to the example, no arcing occurs between the front surface of the stage 3 and the back surface of the wafer W in all the wafers W. On the other hand, as shown in the lower right of FIG. 3, in the case of using the stage according to the comparative example, arcing occurs between the front surface of the stage and the back surface of the wafer W in most of the wafers W. Specifically, in the wafer W of "No. 1", "No. 6", "No. 13", "No. 18" and "No. 24", arcing occurs at 6, 24, 1, 0 and 11 spots, respectively.

As described above, by using the stage 3 according to the example, it is confirmed that the occurrence of arcing between the front surface of the stage 3 and the back surface of the wafers W can be suppressed as compared with the case of using the stage according to the comparative example.

Next, the plasma-based processing apparatus 1 including the stage 3 according to an example in which the substrate mounting portion 35, the edge portion 36, the tapered portion 37 and the bank portion 38 respectively have the surface roughness Ra of 0.02 µm, 10 µm, 2 µm and 10 µm was used to perform the plasma-based process on a wafer W. In addition, a plasma-based processing apparatus including a stage according to a comparative example in which the substrate mounting portion 35, the edge portion 36, the tapered portion 37 and the bank portion 38 respectively have the surface roughness Ra of 10 µm, 10 µm, 0.4 µm and 10 µm was used to perform the plasma-based process on a wafer W. Conditions of the plasma-based process according to the example and the comparative example are similar to those described in the above.

Figure 4:
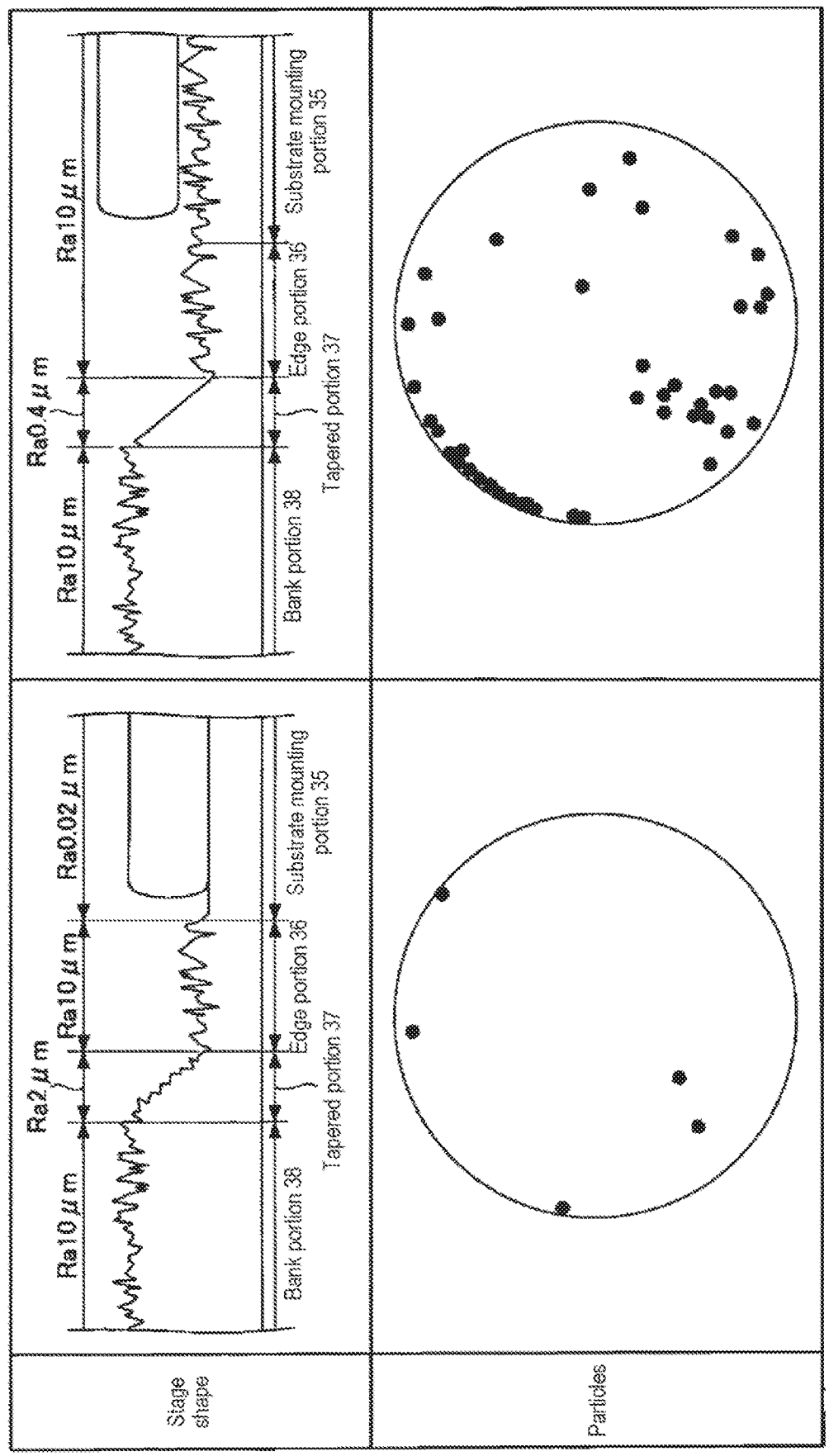
FIG. 4 is a view for explaining a relationship between a stage shape and particles.

FIG. 4 is a view for explaining a relationship between a stage shape and particles. The upper left of FIG. 4 shows a schematic shape of the stage 3 according to the example and the lower left of FIG. 4 shows a distribution of particles adhering to the front surface of the wafer W after performing the plasma-based process on the wafer W mounted on the stage 3 according to the example. The upper right of FIG. 4 shows a schematic shape of the stage according to the comparative example and the lower right of FIG. 4 shows a distribution of particles adhering to the front surface of the wafer W after performing the plasma-based process on the wafer W mounted on the stage according to the comparative example. In the lower left and the lower right of FIG. 4, each plot shows particles adhering to the front surface of the wafer W.

As shown in the lower left of FIG. 4, in the case of using the stage 3 according to the example, five particles adhered to the front surface of the wafer W. On the other hand, as shown in the lower right of FIG. 4, in the case of using the stage according to the comparative example, a large number of particles adhered to the front surface of the wafer W.

As described above, by using the stage 3 according to the example, it is confirmed that particles adhering to the front surface of the wafer W which has been subjected to the plasma-based process can be reduced compared with the case of using the stage according to the comparative example.

Next, the plasma-based processing apparatus 1 including the stage 3 according to an example in which the substrate mounting portion 35, the edge portion 36, the tapered portion 37 and the bank portion 38 respectively have the surface roughness Ra of 0.02 µm, 10 µm, 2 µm and 10 µm was used to perform the plasma-based process on a wafer W. In addition, a plasma-based processing apparatus including a stage according to a comparative example in which the substrate mounting portion 35, the edge portion 36, the tapered portion 37 and the bank portion 38 respectively have the surface roughness Ra of 0.02 µm, 0.02 µm, 0.4 µm and 10 µm was used to perform the plasma-based process on a wafer W. Conditions of the plasma-based process according to the example and the comparative example are similar to those described in the above.

Figure 5:
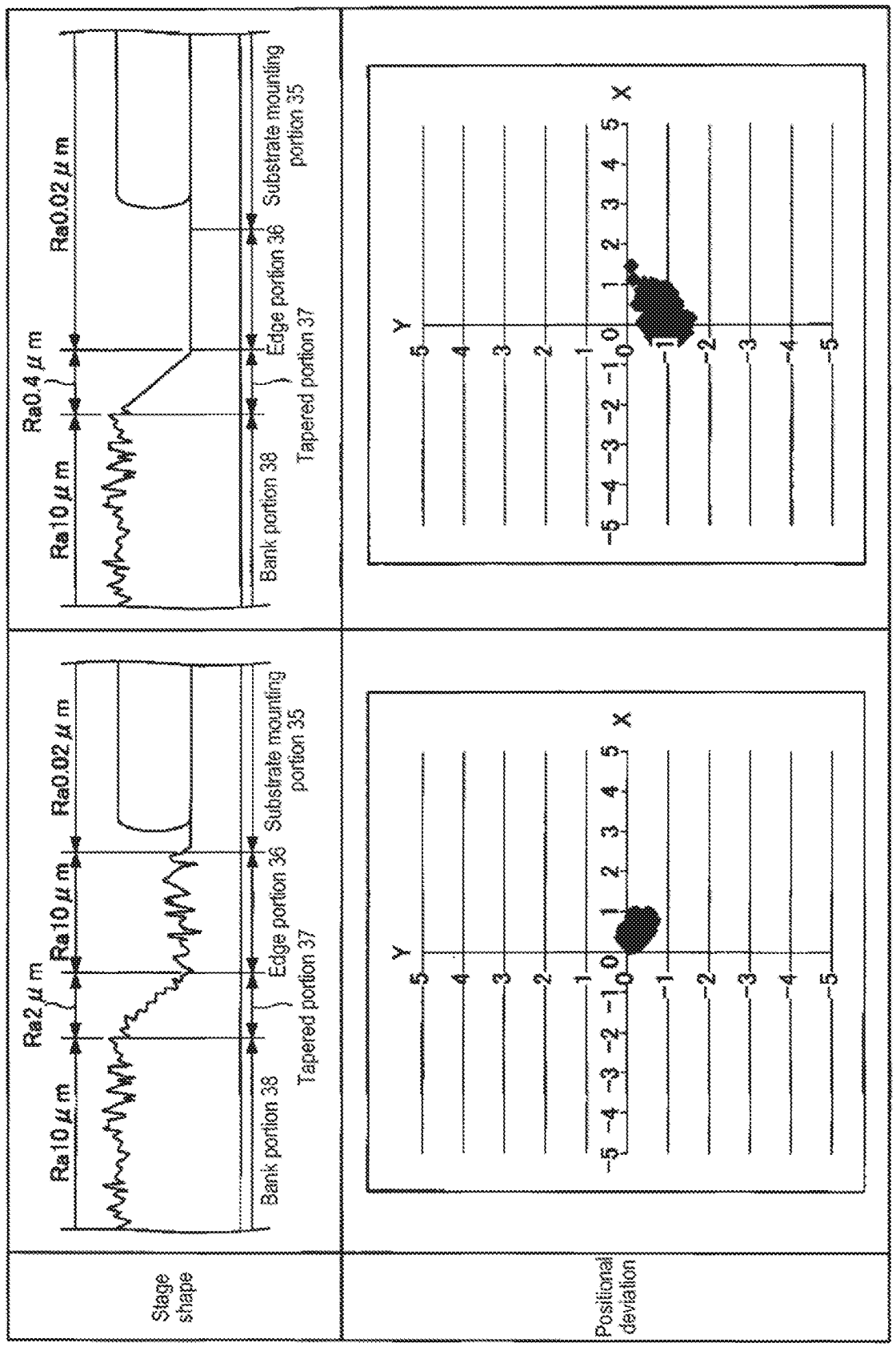
FIG. 5 is a view for explaining a relationship between a stage shape and a wafer positional deviation amount.

FIG. 5 is a view for explaining a relationship between a stage shape and a wafer positional deviation amount. The upper left of FIG. 5 shows a schematic shape of the stage 3 according to the example and the lower left of FIG. 5 shows a positional deviation amount of the wafer W relative to the stage 3 according to the example. The upper right of FIG. 5 shows a schematic shape of the stage according to the comparative example and the lower right of FIG. 5 shows a positional deviation amount of the wafer W relative to the stage according to the comparative example. In the lower left and the lower right of FIG. 5, the abscissa and the ordinate represent a deviation amount (µm) in the X direction and a deviation amount (µm) in the Y direction from the center of the stage in the plane of the stage, respectively. In addition, in the lower left and the lower right of FIG. 5, each plot shows a movement amount (deviation amount) of a position after each of a plurality of wafers W was subjected to the plasma-based process relative to a position before each of the plurality of wafers W is subjected to the plasma-based process.

As shown in FIG. 5, by using the stage 3 according to the example, it is confirmed that the positional deviation of the wafer W relative to the stage 3 can be suppressed as compared with the case of using the stage of the comparative example.

As described above, the stage 3 according to the embodiment of the present disclosure includes the substrate mounting portion 35 subjected to a mirroring treatment surface on which the wafer W is mounted. As a result, the distance between the front surface of the stage 3 and the back surface of the wafer W is narrowed. It is therefore possible to prevent arcing from occurring between the front surface of the stage 3 and the back surface of the wafer W.

Further, the stage 3 includes the edge portion 36 which is located around the substrate mounting portion 35 and is treated to have an uneven shape. As a result, the adhesion of a film formed on the edge portion 36 by the plasma-based process to the stage 3 is improved. Therefore, it is possible to suppress the film formed on the edge portion 36 from being peeled off and adhering as particles to the front surface of the wafer W.

According to the present disclosure in some embodiments, it is possible to provide a substrate mounting table capable of suppressing generation of arcing and particles.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate mounting table for use in a plasma-based processing apparatus that performs a plasma-based process on a substrate inside a processing container, comprising:
    a substrate mounting portion having a front surface subjected to a mirroring treatment and on which the substrate is mounted; and
    an edge portion formed in an annular shape to surround the substrate mounting portion and treated to have an uneven shape, wherein the substrate mounting portion and the edge portion are formed on a bottom surface of a recess formed in the front surface of the substrate mounting table, and wherein the substrate mounting table further comprises a tapered portion formed on an inner side surface of the recess and having a larger surface roughness than the substrate mounting portion and a smaller surface roughness than the edge portion.

2. The substrate mounting table of claim 1, further comprising:
a bank portion formed around the recess and having a surface roughness substantially the same as a surface roughness of the edge portion.

3. The substrate mounting table of claim 1, wherein a surface roughness of the substrate mounting portion is equal to or less than 0.4 μm.

4. The substrate mounting table of claim 1, wherein a surface roughness of the edge portion falls within a range of 1 μm to 10 μm.

5. The substrate mounting table of claim 1, wherein a diameter of the substrate mounting portion falls within a range of 298 mm to 300 mm.

\* \* \* \* \*